(12) United States Patent
Guan

(10) Patent No.: US 11,521,989 B2
(45) Date of Patent: Dec. 6, 2022

(54) DISPLAY SUBSTRATE, DISPLAY APPARATUS AND MANUFACTURING METHOD OF DISPLAY SUBSTRATE

(71) Applicant: Beijing BOE Technology Development Co., Ltd., Beijing (CN)

(72) Inventor: Feng Guan, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 208 days.

(21) Appl. No.: 16/607,932

(22) PCT Filed: Apr. 30, 2019

(86) PCT No.: PCT/CN2019/085166
§ 371 (c)(1),
(2) Date: Oct. 24, 2019

(87) PCT Pub. No.: WO2019/214509
PCT Pub. Date: Nov. 14, 2019

(65) Prior Publication Data
US 2021/0335834 A1  Oct. 28, 2021

(30) Foreign Application Priority Data

May 9, 2018  (CN) .......................... 201810437725.5

(51) Int. Cl.
*H01L 27/12*    (2006.01)
*G02F 1/1333*    (2006.01)

(52) U.S. Cl.
CPC ........ *H01L 27/1222* (2013.01); *G02F 1/1333* (2013.01); *H01L 27/12* (2013.01);
(Continued)

(58) Field of Classification Search
CPC ............. H01L 27/1222; H01L 27/1251; H01L 27/1274; H01L 27/1281; H01L 27/12;
(Continued)

(56) References Cited

U.S. PATENT DOCUMENTS

| 4,444,620 A | * | 4/1984 | Kovacs | ................. | H01L 21/324 |
| | | | | | 117/45 |
| 4,499,657 A | * | 2/1985 | Ooga | ................. | H01L 29/1004 |
| | | | | | 257/592 |

(Continued)

FOREIGN PATENT DOCUMENTS

| CN | 104064451 A | 9/2014 |
| CN | 104779199 A | 7/2015 |

(Continued)

OTHER PUBLICATIONS

First Office Action issued by the Chinese Patent Office in the corresponding Chinese application No. 201810437725.5 dated Apr. 21, 2020.

*Primary Examiner* — Ahmed N Sefer
(74) *Attorney, Agent, or Firm* — Dilworth & Barrese, LLP.; Michael J. Musella, Esq.

(57) ABSTRACT

A display substrate, a display apparatus, and a manufacturing method of the display substrate are provided. The display substrate includes: a base substrate; and a crystallization induction layer and a polysilicon layer stacked on the base substrate. The crystallization induction layer includes induction layer patterns and intervals between the induction layer patterns. The polysilicon layer includes a portion overlapping the induction layer patterns and a portion overlapping the intervals, a crystallinity of the portion of the polysilicon layer overlapping the induction layer patterns is larger than a crystallinity of the portion of the polysilicon layer overlapping the intervals.

19 Claims, 3 Drawing Sheets

(52) U.S. Cl.
CPC ...... *H01L 27/1214* (2013.01); *H01L 27/1251* (2013.01); *H01L 27/1259* (2013.01); *H01L 27/1274* (2013.01); *H01L 27/1281* (2013.01)

(58) Field of Classification Search
CPC ....................... H01L 27/1214; H01L 27/1259; G02F 1/1333
See application file for complete search history.

(56) References Cited

U.S. PATENT DOCUMENTS

| | | | | |
|---|---|---|---|---|
| 4,609,407 | A * | 9/1986 | Masao | H01L 21/268 257/401 |
| 4,643,777 | A * | 2/1987 | Maeda | H01L 28/24 148/DIG. 105 |
| 4,808,546 | A * | 2/1989 | Moniwa | H01L 21/02667 438/166 |
| 4,933,298 | A * | 6/1990 | Hasegawa | H01L 21/02691 438/150 |
| 5,663,579 | A * | 9/1997 | Noguchi | H01L 21/2026 257/75 |
| 6,294,413 | B1 * | 9/2001 | Tseng | H01L 21/84 257/E21.703 |
| 10,312,273 | B2 | 6/2019 | Zhang | |
| 10,473,990 | B2 | 11/2019 | Deng et al. | |
| 2004/0211961 | A1 * | 10/2004 | Koo | H01L 27/1285 257/59 |
| 2004/0245526 | A1 * | 12/2004 | Park | H01L 27/1296 257/72 |
| 2004/0248386 | A1 * | 12/2004 | Nishitani | H01L 21/02532 438/478 |
| 2009/0042343 | A1 | 2/2009 | Kakkad | |
| 2011/0108843 | A1 * | 5/2011 | Im | H01L 27/12 257/64 |
| 2013/0043515 | A1 * | 2/2013 | Huang | H01L 29/1083 257/288 |
| 2014/0363936 | A1 | 12/2014 | Park et al. | |
| 2016/0020096 | A1 | 1/2016 | Zhang | |
| 2018/0034006 | A1 | 2/2018 | Zhang | |
| 2018/0190490 | A1 | 7/2018 | Ma et al. | |

FOREIGN PATENT DOCUMENTS

| | | |
|---|---|---|
| CN | 105390443 A | 3/2016 |
| CN | 105470197 A | 4/2016 |
| CN | 106024639 A | 10/2016 |
| CN | 106024708 A | 10/2016 |
| CN | 106601823 A | 4/2017 |
| CN | 108550583 A | 9/2018 |

* cited by examiner

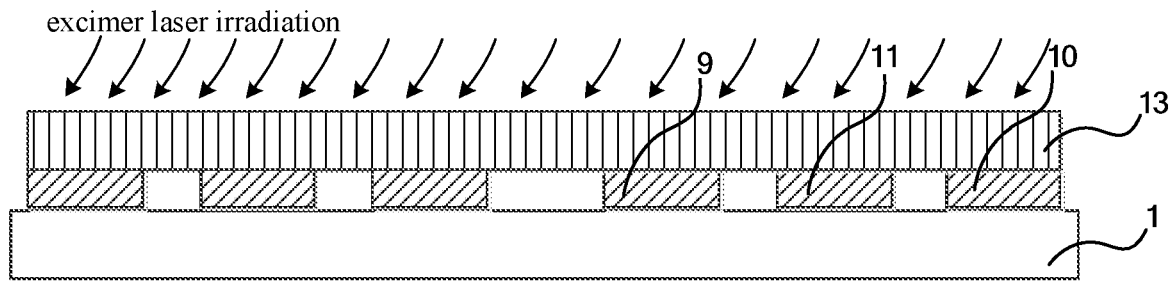

Fig.3

S1 forming an oxide induction layer on a base substrate, and for each thin film transistor, the oxide induction layer comprises a first portion, a second portion, and a third portion respectively spaced apart from the first portion and the second portion with intervals

S2 forming a polysilicon layer on a side of the oxide induction layer away from the base substrate, the polysilicon layer comprises a source region corresponding to the first portion, a drain region corresponding to the second portion, and a third portion corresponding channel region, a source connection region between the source region and the channel region, and a drain connection region between the drain region and the channel region

Fig.4

DISPLAY SUBSTRATE, DISPLAY APPARATUS AND MANUFACTURING METHOD OF DISPLAY SUBSTRATE

CROSS-REFERENCE TO RELATED APPLICATIONS

The application claims priority of the Chinese patent application No. 201810437725.5, filed on May 9, 2018, the entire disclosure of which is incorporated herein by reference as part of the present application.

TECHNICAL FIELD

The disclosure relates to a display substrate, a display apparatus, and a manufacturing method of the display substrate.

BACKGROUND

A thin film transistor (referred as TFT) is one of types of field effect transistors and is mainly applied in a panel display apparatus. In the existing panel display apparatus, a thin film transistor liquid crystal display (referred as TFT-LCD) and a popular active-matrix organic light emitting diode (referred as AMOLED) dominate the existing panel display market. Depending on a type of silicon used as a semiconductor layer, TFTs can be generally classified into a TFT using a semiconductor film formed of amorphous silicon, and a TFT using a semiconductor film formed of polysilicon having a crystalline phase. Because the semiconductor made of the polysilicon has a larger carrier mobility than the semiconductor made of the amorphous silicon, using the polysilicon as an active layer in a TFT device can improve TFT device performance.

Low temperature poly-silicon (referred as LTPS) is a kind of polysilicon, which is generally obtained by crystallizing amorphous silicon by excimer laser annealing (referred as ELA). When the low-temperature polysilicon is produced, the amorphous silicon film layer is irradiated with an excimer laser, after the surface of the amorphous silicon film is melted, heat will continue to be transferred downward, and the entire film layer is almost fully melted, at this time, underlying amorphous silicon particles as seed crystals grow horizontally and vertically to obtain larger size grains.

SUMMARY

At least one embodiment of the disclosure provides a display substrate comprising: a base substrate; and a crystallization induction layer and a polysilicon layer stacked on the base substrate, wherein the crystallization induction layer comprises induction layer patterns and intervals between the induction layer patterns, the polysilicon layer comprises a portion overlapping the induction layer patterns and a portion overlapping the intervals, a crystallinity of the portion of the polysilicon layer overlapping the induction layer patterns is larger than a crystallinity of the portion of the polysilicon layer overlapping the intervals.

In some examples, the polysilicon layer comprises a source region, a drain region, and a channel region between the source region and the drain region, a source connection region between the source region and the channel region, and a drain connection region between the drain region and the channel region; the portion of the polysilicon overlapping the induction layer pattern comprises the source region, the drain region, and the channel region, and the portion of the polysilicon overlapping the intervals comprises the source connection region and the drain connection region.

In some examples, the crystallization induction layer is an oxide induction layer.

In some examples, a material of the oxide induction layer is MgO or $SiO_2$.

In some examples, a material of the oxide induction layer is MgO and a thickness of the oxide induction layer is in a range from 10 Å to 20,000 Å.

In some examples, the crystallization induction layer is located between the polysilicon layer and the base substrate.

In some examples, the crystallization induction layer and the polysilicon layer are in contact with each other.

In some examples, the display substrate further comprises: a buffer layer between the base substrate and the crystallization induction layer.

In some examples, a material of the buffer layer is $SiN_X$ or $SiO_X$.

At least one embodiment of the disclosure provides a display apparatus comprising the display substrate of any of the above.

At least one embodiment of the disclosure provides a manufacturing method of a display substrate, comprising: forming a crystallization induction layer on a base substrate, the crystallization induction layer comprising induction layer patterns and intervals between the induction layer patterns; forming an amorphous silicon layer on a side of the crystallization induction layer away from the base substrate, and performing a crystallization process on the amorphous silicon layer to form a polysilicon layer, wherein the polysilicon layer comprises a portion overlapping the induction layer patterns and a portion overlapping the intervals, a crystallinity of the portion of the polysilicon layer overlapping the induction layer patterns is larger than a crystallinity of the portion of the polysilicon layer overlapping the intervals.

In some examples, the crystallization induction layer is an oxide induction layer.

In some examples, a material of the oxide induction layer is MgO or $SiO_2$.

In some examples, a material of the oxide induction layer is MgO, and forming the crystallization induction layer on the base substrate comprises: forming an oxide induction material layer having a thickness in a range from 10 Å to 20000 Å on the base substrate by using an electron beam evaporation preparation process; patterning the oxide induction material layer to form the crystallization induction layer.

In some examples, the crystallization process comprises: performing excimer laser irradiation on the amorphous silicon layer.

In some examples, the manufacturing method further comprises patterning the polysilicon layer.

In some examples, the manufacturing method further comprises: forming a buffer layer on the base substrate before forming the crystallization induction layer on the base substrate.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

FIG. 3 is a schematic view showing that excimer laser irradiation is performed on the display substrate of an embodiment of the disclosure;

FIG. 4 is a flow chart of a manufacturing method of a display substrate of an embodiment of the disclosure;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Utilizing an excimer laser annealing crystallization process to obtain low-temperature polysilicon has defects such as a certain proportion of grain boundaries etc., resulting in a carrier mobility of the polysilicon TFT far less than a carrier mobility of a large single crystal silicon TFT. In order to meet the increasing performance of TFT performance in terms of device performance, it is of great significance to improve the carrier mobility of the existing low-temperature polysilicon TFTs.

Embodiments of the disclosure provide a display substrate, a display apparatus, and a manufacturing method of the display substrate. For example, polysilicon grains formed in accordance with the embodiments of the disclosure are uniform, improving the performance of thin film transistor (TFT) devices on the display substrate.

Figure 1:
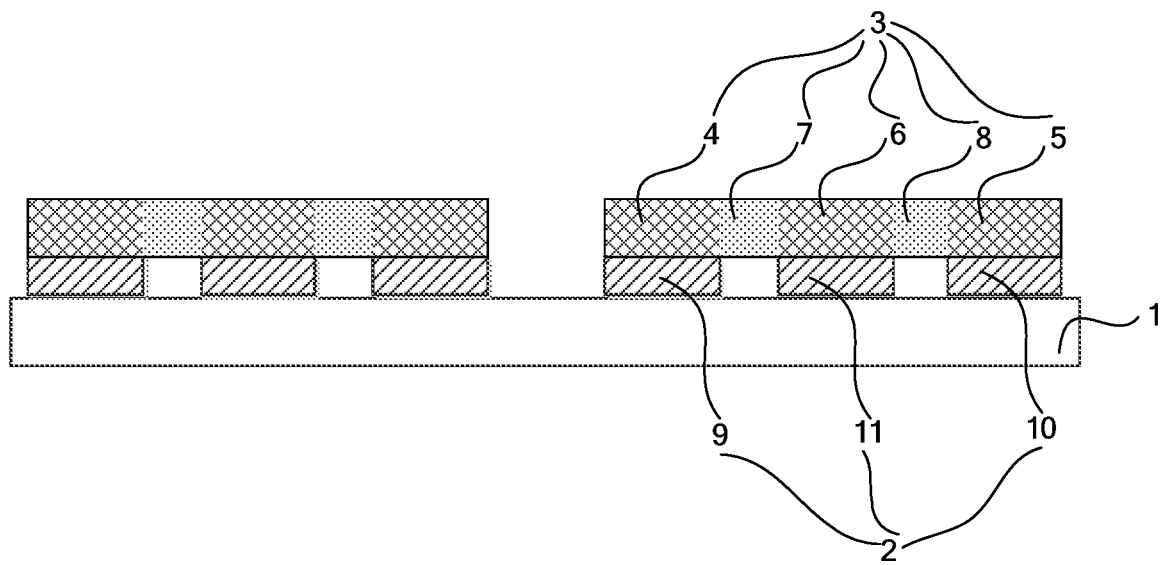
FIG. 1 is a schematic view of a display substrate of an embodiment of the disclosure.

As shown in FIG. 1, a display substrate according to an embodiment of the disclosure comprises a base substrate 1 and an oxide induction layer 2 and a polysilicon layer 3 sequentially disposed in a direction away from the base substrate 1. For example, the oxide induction layer 2 is disposed on the base substrate, and the polysilicon layer 2 is disposed on a side of the oxide induction layer away from the base substrate.

In some embodiments, as shown in FIG. 1, the oxide induction layer 2 comprises induction layer patterns 9, 10, 11 with intervals between the induction layer patterns 9, 10, 11. The polysilicon layer comprises a portion overlapping the induction layer patterns 9, 10, 11 and a portion overlapping the intervals. In a crystallization process of the amorphous silicon layer, a crystallinity of the portion overlapping the induction layer patterns 9, 10, 11 is larger than a crystallinity of the portion overlapping the intervals. For example, the crystallinity can be measured by the average grain size in the polysilicon layer. The larger the average grain size, the higher the crystallinity.

The polysilicon layer which is subjected to the crystallization process has a plurality of regions with different crystallinities by patterning the induction layer as a patterned layer. For example, the polysilicon with different crystallinities can have different carrier mobilities.

For example, the above polysilicon layer 3 can be used as an active layer of a thin film transistor. For example, as shown in FIG. 1, the polysilicon layer 3 comprises a source region 4, a drain region 5, and a channel region 6 between the source region 4 and the drain region 5, as well as a source connection region 7 between the source region 4 and the channel region 6 and a drain connection region 8 between the drain region 5 and the channel region 6.

The oxide induction layer 2 comprises a first portion 9 corresponding to the source region 4, a second portion 10 corresponding to the drain region 5, and a third portion 11 corresponding to the channel region 6. The third portion 11 is respectively spaced apart from the first portion 9 and the second portion 10 with intervals. Therefore, the source connection region 7 and the drain connection region 8 respectively correspond to the intervals between the induction layer patterns, that is, overlap with the intervals between the induction layer patterns.

In the embodiment of the disclosure, the first portion 9 of the oxide induction layer 2 corresponds to the source region 4, and it can be understood that projections of the first portion 9 and the source region 4 on the base substrate 1 overlap, similarly, the second portion 10 of the oxide induction layer 2 corresponds to the drain region 5, and it can be understood that projections of the second portion 10 and the drain connection region 5 on the base substrate 1 overlap, and the third portion 11 of the oxide induction layer 2 corresponds to the channel region 6, and it can be understood that projections of the third portion 11 and the channel region 6 on the base substrate 1 overlap.

As described above, because the crystallinity of the polysilicon portion corresponding to the induction layer patterns is higher and the crystallinity of the polysilicon portion corresponding to the intervals is lower, the source region and the drain region can have higher carrier mobility and the source connection region and the drain connection region have lower carrier mobility. Therefore, the source connection region and the drain connection region can reduce the leakage current of the thin film transistor, similarly to the light doped region of the thin film transistor. That is to say, the polysilicon with different crystallinities is formed by using the patterned induction layer, thereby effectively controlling the leakage current. Further, because the above polysilicon having a plurality of regions with different crystallinities can be achieved by the patterned induction layer, the process can be simplified.

In the embodiment of the disclosure, a specific material of the base substrate 1 is not limited, and for example, glass, resin, plastic, or the like can be employed.

Figure 2:
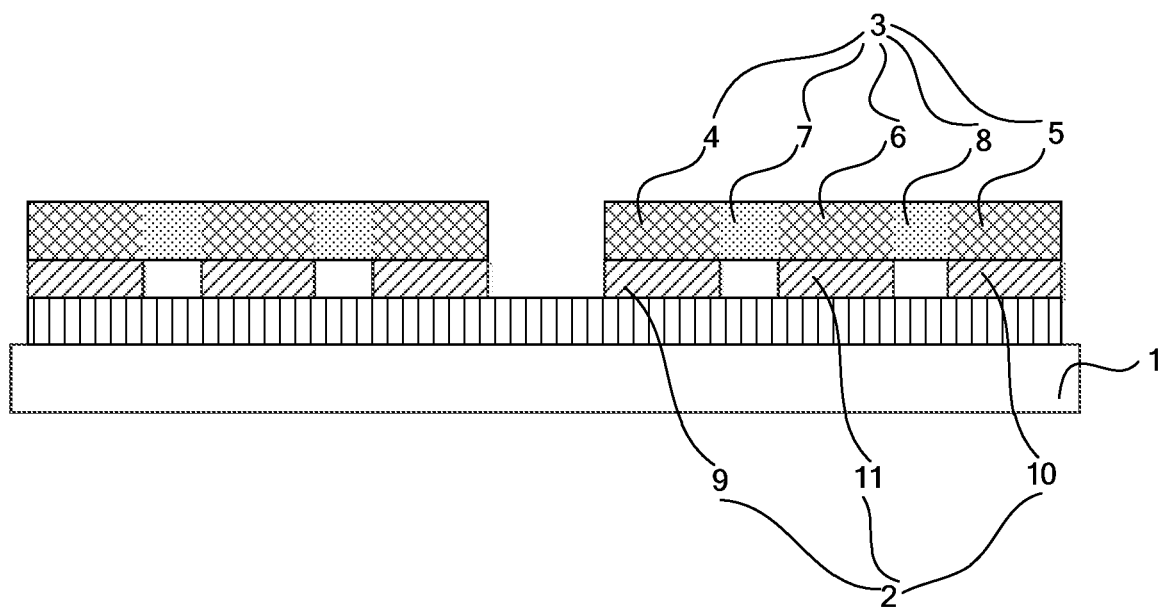
FIG. 2 is a schematic view of a display substrate of another embodiment of the disclosure.

As shown in FIGS. 1 to 3, in an embodiment of the disclosure, the material of the oxide induction layer 2 is MgO or $SiO_2$. For example, the material of the oxide induction layer 2 is MgO, and a thickness of the oxide induction layer 2 is from 10 to 20,000 Å. MgO has a good crystal orientation and has a good match with the Si lattice. The lattice of MgO will induce the crystallization of the amorphous silicon and the crystal quality of the polysilicon is improved.

An example in which the oxide induction layer is an induction layer for the crystallization of the amorphous silicon is illustrated above. However, the embodiments according to the disclosure are not limited thereto, and any appropriate crystallization induction layer can be applied in the embodiments of the disclosure.

As shown in FIG. 2, in an embodiment of the disclosure, the display substrate further comprises: a buffer layer 12 between the base substrate 1 and the oxide induction layer 2. The material of the buffer layer 12 is not limited and can be, for example, $SiN_X$ or $SiO_X$. When the base substrate 1 is glass, the buffer layer 12 can prevent the sodium ions or the like on the base substrate 1 from entering the oxide induction layer 2.

Further, an example in which the polysilicon layer is on a side of the induction layer away from the base substrate is illustrated above, however, the embodiment according to the disclosure is not limited thereto. For example, the polysilicon layer can also be located on a side of the induction layer close to the base substrate, provided that the polysilicon layer and the induction layer are in contact with each other and the amorphous silicon layer can be induced by the induction layer when the amorphous silicon layer is crystallized.

The embodiment of the disclosure further provides a display apparatus, comprising the display substrate of any of the above described technical solutions. Because the TFT performance of the display substrate is better, the display apparatus has better product quality. A specific type of the display apparatus is not limited, and can be, for example, a TFT-LCD display apparatus, an AMOLED display apparatus, or the like; the specific product type of the display apparatus is not limited, and can be, for example, a display, a display screen, a panel television, or the like.

As shown in FIG. 1 and FIG. 4, an embodiment of the disclosure further provides a manufacturing method of a display substrate, comprising following steps:

Step S1, forming an oxide induction layer 2 on a base substrate 1, and for each thin film transistor, the oxide induction layer 2 comprises a first portion 9, a second portion 10, and a third portion 11 respectively spaced apart from the first portion 9 and the second portion 10 with intervals; for example, in the step, an induction oxide material layer can be formed firstly, and then the induction oxide material layer is patterned to form induction layer patterns 9, 10, 11 and intervals between the induction layer patterns.

Step S2, forming a polysilicon layer 3 on a side of the oxide induction layer 2 away from the base substrate 1, the polysilicon layer 3 comprises a source region 4 corresponding to the first portion 9, a drain region 5 corresponding to the second portion 10, and a third portion 11 corresponding channel region 6, as well as a source connection region 7 between the source region 4 and the channel region 6 and a drain connection region 8 between the drain region 5 and the channel region 6; for example, in the step, an amorphous silicon layer is formed on the patterned induction layer, and then the amorphous silicon layer is crystallized so that a crystallinity of the portion overlapping the induction layer patterns 9, 10, 11 is larger than a crystallinity of the portion overlapping the intervals.

In an embodiment of the disclosure, a material of the oxide induction layer 2 is MgO or $SiO_2$.

Figure 5:
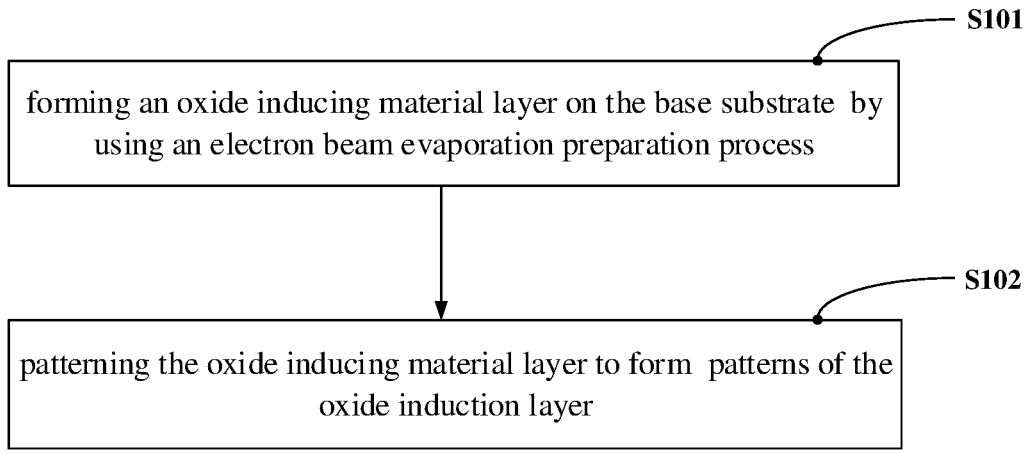
FIG. 5 is a flow chart of manufacturing an induction layer of a display substrate of an embodiment of the disclosure.

As shown in FIG. 1 and FIG. 5, an embodiment of the disclosure provides a manufacturing method of a display substrate, wherein the material of the oxide induction layer 2 is MgO, and forming the oxide induction layer 2 on the base substrate 1 comprises following steps:

Step S101, forming an oxide induction material layer having a thickness of 10 to 5000 Å on the base substrate 1 by using an electron beam evaporation preparation process;

Step S102, patterning the oxide induction material layer to form patterns of the oxide induction layer 2.

Figure 6:
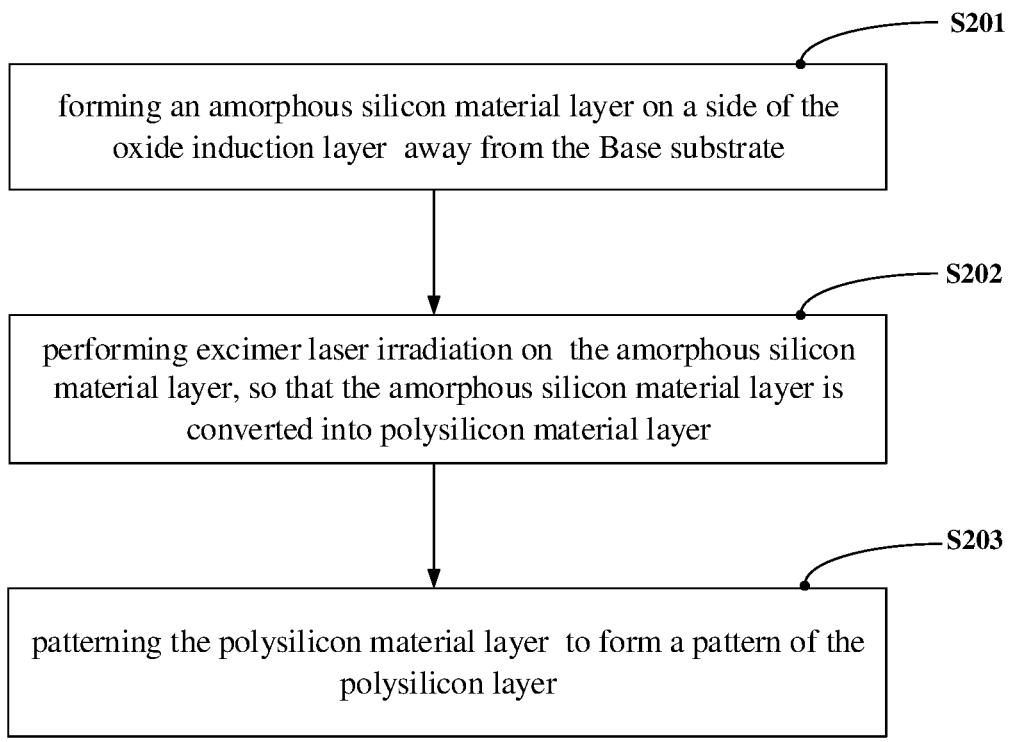
FIG. 6 is a flow chart of manufacturing a polysilicon layer of a display substrate of an embodiment of the disclosure.

As shown in FIG. 1, FIG. 3 and FIG. 6, an embodiment of the disclosure provides a manufacturing method of a display substrate, wherein forming the polysilicon layer 3 on the side of the oxide induction layer 2 away from the base substrate 1 comprises following steps:

Step S201, forming an amorphous silicon material layer 13 on the side of the oxide induction layer 2 away from the base substrate 1;

Step S202, crystallizing the amorphous silicon material layer 13 (for example, excimer laser irradiation), so that the amorphous silicon material layer 13 is converted into polysilicon material layer 3;

Step S203, patterning the polysilicon material layer 3 to form a pattern of the polysilicon layer 3.

According to the manufacturing methods of the above embodiments of the disclosure, firstly, an induction layer is formed between the base substrate and the amorphous silicon layer, and MgO is selected as an oxide inducement layer material because of having a good crystal orientation and having a good match with the Si lattice; then, the excimer laser irradiation is performed on the amorphous silicon layer, and in the process of the excimer laser irradiation on the amorphous silicon layer, the lattice of MgO will induce the crystallization of the amorphous silicon, and in the process the source connection region and the drain connection region with lower crystallinity is naturally formed which can effectively control the leakage current. In addition, the polysilicon formed in the source region and the drain region has better grain uniformity and higher mobility, and the performance of the TFT device on the display substrate is improved.

As shown in FIG. 2, according to the array substrate manufactured by the method of the embodiments, before the step of forming the oxide induction layer 2 on the base substrate 1, it further comprises: forming a buffer layer 12 on the base substrate 1. A material of the buffer layer 12 is not limited, for example, it can be $SiN_X$ or $SiO_X$.

The above description is only an exemplary embodiment of the disclosure, and is not intended to limit the scope of the disclosure. The scope of the disclosure is determined by the appended claims.

The invention claimed is:

1. A display substrate, comprising:
  a base substrate;
  a crystallization induction layer and a polysilicon layer stacked on the base substrate,
  wherein the crystallization induction layer comprises induction layer patterns and intervals between the induction layer patterns, the polysilicon layer comprises a portion overlapping the induction layer patterns and a portion overlapping the intervals, a crystallinity of the portion of the polysilicon layer overlapping the induction layer patterns is larger than a crystallinity of the portion of the polysilicon layer overlapping the intervals.

2. The display substrate of claim 1, wherein the polysilicon layer comprises a source region, a drain region, and a channel region between the source region and the drain region, a source connection region between the source region and the channel region, and a drain connection region between the drain region and the channel region;
  the portion of the polysilicon overlapping the induction layer pattern comprises the source region, the drain region, and the channel region, and the portion of the polysilicon overlapping the intervals comprises the source connection region and the drain connection region.

3. The display substrate of claim 1, wherein the crystallization induction layer is an oxide induction layer.

4. The display substrate of claim 3, wherein a material of the oxide induction layer is MgO or $SiO_2$.

5. The display substrate of claim 4, wherein a material of the oxide induction layer is MgO and a thickness of the oxide induction layer is in a range from 10 Å to 20,000 Å.

6. The display substrate of claim 1, wherein the crystallization induction layer is located between the polysilicon layer and the base substrate.

7. The display substrate of claim 6, wherein the crystallization induction layer and the polysilicon layer are in contact with each other.

8. The display substrate of claim 6, further comprising: a buffer layer between the base substrate and the crystallization induction layer.

9. The display substrate of claim 8, wherein a material of the buffer layer is $SiN_X$ or $SiO_X$.

10. A display apparatus comprising the display substrate of claim 1.

11. A manufacturing method of a display substrate, comprising:
   forming a crystallization induction layer on a base substrate, the crystallization induction layer comprises induction layer patterns and intervals between the induction layer patterns;
   forming an amorphous silicon layer on a side of the crystallization induction layer away from the base substrate, and performing a crystallization process on the amorphous silicon layer to form a polysilicon layer, the crystallization induction layer and the polysilicon layer are stacked on the base substrate, wherein the polysilicon layer comprises a portion overlapping the induction layer patterns and a portion overlapping the intervals, a crystallinity of the portion of the polysilicon layer overlapping the induction layer patterns is larger than a crystallinity of the portion of the polysilicon layer overlapping the intervals.

12. The manufacturing method of the display substrate of claim 11, wherein the crystallization induction layer is an oxide induction layer.

13. The manufacturing method of the display substrate of claim 12, wherein a material of the oxide induction layer is MgO or $SiO_2$.

14. The manufacturing method of the display substrate of claim 13, wherein a material of the oxide induction layer is MgO, and forming the crystallization induction layer on the base substrate comprises:
   forming an oxide induction material layer having a thickness in a range from 10 Å to 20000 Å on the base substrate by using an electron beam evaporation preparation process;
   patterning the oxide induction material layer to form the crystallization induction layer.

15. The manufacturing method of the display substrate of claim 11, wherein the crystallization process comprises: performing excimer laser irradiation on the amorphous silicon layer.

16. The manufacturing method of the display substrate of claim 15, further comprising: patterning the polysilicon layer.

17. The manufacturing method of the display substrate of claim 11, further comprising: forming a buffer layer on the base substrate before forming the crystallization induction layer on the base substrate.

18. A thin film transistor, comprising an active layer made of polysilicon, wherein
   the active layer includes a source region, a drain region and a channel region,
   the active layer further includes a source connection region between the source region and the channel region, and a drain connection region between the drain region and the channel region,
   the source region, the drain region and the channel region have a crystallinity larger than that of the source connection region and the drain connection region,
   the active layer is disposed on an oxide induction layer, and the oxide induction layer comprises a first portion, a second portion, and a third portion spaced apart from each other and respectively correspond to the source region, the drain region and the channel region.

19. The thin film transistor of claim 18, wherein the first portion, the second portion and the third portion of the oxide induction layer are spaced apart from each other with intervals, and the source connection region and the drain connection region correspond to the intervals, respectively.

* * * * *